(12) United States Patent
Nugent, Jr. et al.

(10) Patent No.: US 12,355,265 B2
(45) Date of Patent: Jul. 8, 2025

(54) REMOTE POWER BEAM-SPLITTING

(71) Applicant: LASERMOTIVE, INC., Kent, WA (US)

(72) Inventors: Thomas J. Nugent, Jr., Bellevue, WA (US); Thomas W. Bashford, Renton, WA (US); Alexander Hay, Bellevue, WA (US); David Bashford, Kent, WA (US)

(73) Assignee: LaserMotive, Inc., Kent, WA (US)

( * ) Notice: Subject to any disclaimer, the term of this patent is extended or adjusted under 35 U.S.C. 154(b) by 479 days.

(21) Appl. No.: 17/613,015

(22) PCT Filed: May 21, 2020

(86) PCT No.: PCT/US2020/034093
§ 371 (c)(1),
(2) Date: Nov. 19, 2021

(87) PCT Pub. No.: WO2020/237099
PCT Pub. Date: Nov. 26, 2020

(65) Prior Publication Data
US 2022/0224164 A1 Jul. 14, 2022

Related U.S. Application Data

(60) Provisional application No. 62/851,037, filed on May 21, 2019.

(51) Int. Cl.
*H02J 50/30* (2016.01)
*H02S 40/22* (2014.01)

(52) U.S. Cl.
CPC .............. *H02J 50/30* (2016.02); *H02S 40/22* (2014.12)

(58) Field of Classification Search
CPC ................................ H02J 50/30; H02S 40/22
See application file for complete search history.

(56) References Cited

U.S. PATENT DOCUMENTS

| | | | |
|---|---|---|---|
| 4,834,805 A | 5/1989 | Erbert | |
| 7,855,335 B2 | 12/2010 | Maeda | |
| 11,105,954 B2 * | 8/2021 | Kare | G01S 17/89 |
| 2009/0056787 A1 | 3/2009 | Johnson et al. | |
| 2010/0012819 A1 | 1/2010 | Graham | |
| 2013/0186451 A1 * | 7/2013 | Tanti | H01L 31/0547 136/246 |
| 2014/0261625 A1 | 9/2014 | Morgan et al. | |
| 2017/0104444 A1 * | 4/2017 | Jungwirth | H02S 40/22 |
| 2018/0315877 A1 * | 11/2018 | Kelzenberg | H02S 40/22 |
| 2019/0019912 A1 | 1/2019 | Nugent, Jr. et al. | |

OTHER PUBLICATIONS

"International Search Report Issued in PCT Application No. PCT/US20/34093", Mailed Date: Aug. 19, 2020, 10 Pages.

* cited by examiner

*Primary Examiner* — Georgia Y Epps
*Assistant Examiner* — Don J Williams (57) ABSTRACT

A remote power system includes a remote power transmitter arranged to output a high-flux power beam and a remote power receiver arranged to receive the high-flux power beam. The receiver has a plurality of photo-voltaic (PV) cells mounted to generate electrical power from energy in the high-flux power beam, at least one non-PV structure adjacent to each PV cell, and a plurality of structures to steer flux toward selected ones of the plurality of PV cells and away from selected ones of the at least one non-PV structure.

26 Claims, 7 Drawing Sheets

REMOTE POWER BEAM-SPLITTING

CROSS-REFERENCE TO RELATED APPLICATION

This application claims benefit under 35 U.S.C. § 371 of PCT Application No. PCT/US20/34093, which claimed benefit under 35 U.S.C. § 119 (e) of U.S. Provisional Patent Application No. 62/851,037, filed May 21, 2019, both of which is are incorporated herein by reference to the extent not inconsistent herewith.

This invention was made with government support under N0014-19-C-2006 awarded by the Office of Naval Research. The government has certain rights in the invention.

BACKGROUND

The present disclosure generally relates to remote power beaming. More particularly, but not exclusively, the present disclosure relates to splitting a power beam at the receiver for improved delivery of remote power.

Some aspects of technologies and related art that may be useful in understanding the background of the present disclosure are described in the following publications:

Published U.S. Patent application 2014/0318620 A1 of Kare et al., which describes a device for converting electromagnetic radiation into electricity;

Published International Patent Application WO 2016/187328 A1 of Kare et al., which describes a power beaming vertical cavity surface emitting laser (VCSEL);

Published U.S. Patent application 2019/0020304 A1 of Bashford et al., which describes a power receiver with shingled PV cells;

Published International Patent Application WO 2017/147206 A1 of Nugent et al., which describes a remote power safety system;

U.S. Pat. No. 10,634,813 of Kare et al., which describes a multi-layered safety system;

U.S. Pat. No. 9,800,091 of Olsson et al., which describes an energy efficient vehicle with integrated power beaming;

Published U.S. Patent application 2018/0136335 A1 of Kare et al., which describes a diffusion safety system.

Each of the above-mentioned documents is incorporated by reference herein to the extent not inconsistent herewith.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventors' approach to the particular problem, which in and of itself may also be inventive.

SUMMARY

The following is a summary of the present disclosure to provide an introductory understanding of some features and context. This summary is not intended to identify key or critical elements of the present disclosure or to delineate the scope of the disclosure. This summary presents certain concepts of the present disclosure in a simplified form as a prelude to the more detailed description that is later presented.

The device, method, and system embodiments described in this disclosure split a high intensity power beam at the receiver for improved delivery of flux to the receiver's energy conversion elements. The beam splitting, which is performed by particular optical structures, improves efficiency of the power beaming system by producing more electrical power from the received light and reducing waste heat. The teaching of the present disclosure may be applied to free-space power beaming systems, mechanical light transmissive mediums (e.g., fiber-optic cable), and other remote power beaming systems.

The teaching of the present disclosure may be applied in embodiments arranged for flat photo-voltaic (PV) arrays, circular ring PV arrays, and other configurations. In some cases, embodiments are arranged with multiple optics. In other cases, embodiments are arranged with a single optic to handle multiple functions such as shaping and splitting light from a high-energy beam.

In certain cases disclosed herein, lenslets are arranged to shape light from the high-energy beam. While lenslet arrays have been conventionally used to shape a beam (e.g., into a square shape) and/or to homogenize a beam, the use of lenslets (e.g., individually, in an array, or in another configuration) to split a high intensity laser power beam so that sub-parts of the beam are individually directed onto separate photo-voltaic (PV) cells is new. The teaching of the present disclosure is distinguished from known solar concentrators, which are used in different ways and for different purposes.

One benefit provided by the embodiments disclosed herein includes directing a higher fraction of the flux that reaches the receiver to impinge on the PV cells as opposed to being wasted by hitting structural materials, electronic materials, or other materials. Another benefit is that at least some of the embodiments increase the intensity of energy received on the PV cells, and this increase is generally associated with higher PV efficiency. At least some of the embodiments permit individual PV cells to be separated by a greater distance than in conventional systems, which improves thermal management and wire routing.

In some cases, a grid of round, square, or otherwise shaped lenses has a size larger than the planned high-energy power beam spot size. The grid may be formed of individual lenslets cells shaped to reduce any gaps between the lenslets. In some embodiments, it is desirable to have no gap between the shaped lenses, and in these cases, for example, a lens surface fills the unit cell, which is different from most known lens arrays where each lens surface is contained or otherwise supported within a lenslet cell, and where unused space is left. In at least some embodiments taught in the present disclosure each lenslet has an area larger than its respective PV cell. In these cases, and lenslet will focus a portion of the high-energy power beam to a spot size that is about the same size as or smaller than the PV active area of the corresponding PV cell, thereby creating a more focused area of high-energy power beam intensity within the boundaries, by at least some margin, of the respective PV cell.

There are a variety of ways to make lenslet arrays with reduced gaps between individual lenslets. In some cases, individual lenslets are assembled with thin, substantially invisible bond lines. In some cases, individual lenslets are machined from one piece, stamped in one piece, or made as a holographic optical element, and in still other cases, individual lenslets are made in a different way.

In some cases, a concentrating lens array is arranged as described herein. In some cases, diverging lenses are added (e.g., one per PV cell) to change an angular spread of incoming flux so that a range of incident angles is narrower (e.g., the light rays are closer to being collimated and at normal angle incidence on the PV cells). Such improvements provide benefits, for example, in multi-layer PV cells where PV efficiency improves with a narrower range of incident angle of the power beam. In at least some embodiments, the narrower range is a steeper incident angle, which may in some cases be orthogonal or substantially orthogonal.

In these and still other cases, reflective structures may be deployed with, or instead of, refractive structures. The reflective (e.g., mirrored) surfaces may be arranged above (i.e., closer to the transmitter), between, and above and between PV cells to reflect portions of the high power beam that would normally not impinge the PV cells. By performing the reflecting, a portion of the high-energy flux will be reflected at an angle that causes the flux to impinge the PV cells. The reflection structures can be flat or curved (e.g., in the style of a compound parabolic or otherwise curved concentrator), and in some cases, beam splitting optics (e.g., lenslets, prisms, or other optics) can also be arranged relative to the high-flux power beam to cause the center of each "beamlet" to be shifted relative to the center of the high-flux power beam incident on the lenslet. In this arrangement, the portion of the high-flux power beam that passes through the lenslet will strike a desired location of the PV cell.

This Brief Summary has been provided to describe certain concepts in a simplified form that are further described in more detail in the Detailed Description. The Brief Summary does not limit the scope of the claimed subject matter, but rather the words of the claims themselves determine the scope of the claimed subject matter.

BRIEF DESCRIPTION OF THE DRAWING

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. Features of the depicted embodiments that are not directly relevant to the novel elements discussed may be omitted for clarity. One or more embodiments are described hereinafter with reference to the accompanying drawings as follows.

DETAILED DESCRIPTION

The present disclosure may be understood more readily by reference to this detailed description and the accompanying figures. The terminology used herein is for the purpose of describing specific embodiments only and is not limiting to the claims unless a court or accepted body of competent jurisdiction determines that such terminology is limiting. Unless specifically defined herein, the terminology used herein is to be given its traditional meaning as known in the relevant art.

The device, method, and system embodiments described in this disclosure split a high intensity power beam at the receiver for improved delivery of flux to the receiver's energy conversion elements (e.g., photo-voltaic (PV) cells). The beam splitting, which is performed by particular optical structures, improves efficiency of the power beaming system by producing more electrical power from the received light and reducing heat. The teaching of the present disclosure may be applied to free-space power beaming systems, solid light transmissive mediums (e.g., fiber-optic cable or other waveguides), and other remote power beaming systems.

The terms "power beam," "high-flux power beam," and the like are used interchangeably, in all their grammatical forms, throughout the present disclosure and claims to refer to a high-flux light transmission that may include a field of light, that may be generally directional, and that may be arranged for steering/aiming to a suitable receiver. The power beams discussed in the present disclosure include beams formed by high-flux laser diodes, fiber lasers, or other like sources sufficient to deliver a desirable level of power to a remote receiver without passing the power over a conventional electrical conduit such as wire.

In the present disclosure, the term "light," when used as part of a light-based transmitter or a light-based receiver, refers to a transmitter or receiver arranged to produce or capture, as the case may be, electromagnetic radiation that falls within the range of frequencies that can be directed (e.g., reflected, refracted, filtered, absorbed, captured, and the like) by optical or quasi-optical elements, and which is defined in the electromagnetic spectrum spanning from extremely low frequencies (ELF) through gamma rays, and which includes at least ultraviolet light, visible light, long-, mid- and short-wavelength infrared light, terahertz radiation, millimeter waves, microwaves, and other visible and invisible light.

In the present disclosure, the term "flux" means power, and unless context dictates otherwise, it specifically means optical power, such as a selected amount of electromagnetic radiation reaching a receiver where some or all of it may be converted to electrical power.

In the present disclosure, the term "contiguous region," as applied to a power beam, means that an area illuminated by the beam is entirely connected. Two noncontiguous regions are presumed not to overlap, unless context dictates otherwise. It will be understood that a power beam may include a small amount of light illuminating an area between two regions that are described as "noncontiguous," but this illumination is of substantially lower intensity than the intensity of illumination of the regions, for example 10% of their intensity, 5% of their intensity, 1% of their intensity, 0.1% of their intensity, 0.01% of their intensity, or substantially zero intensity.

Figure 1A:
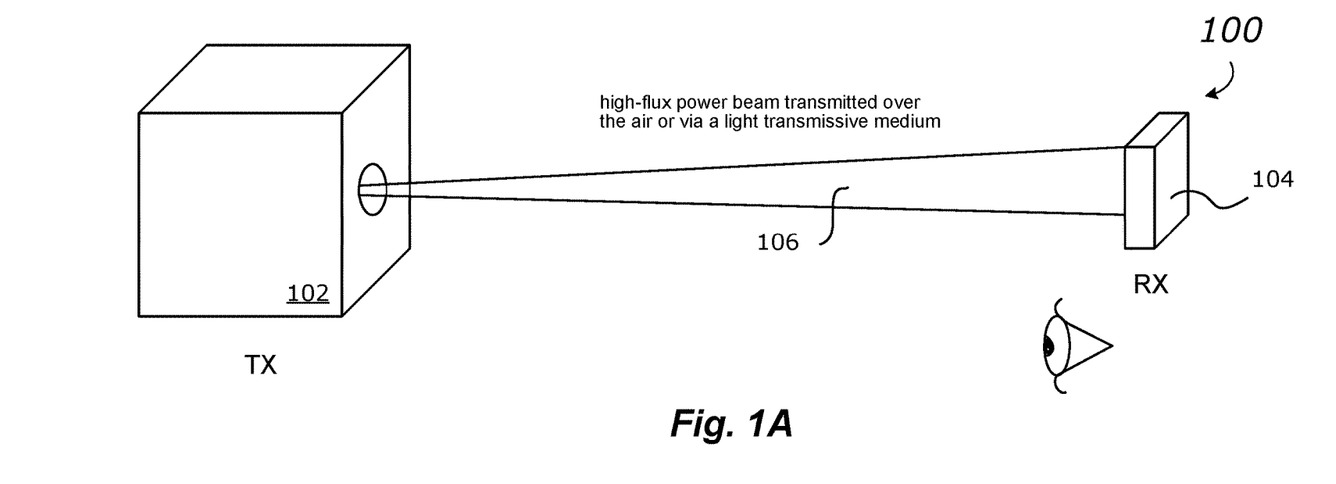
FIG. 1A and FIG. 1B depict one form of remote power delivery via a laser power beaming system. Collectively, FIG. 1A and FIG. 1B may be referred to herein as FIG. 1.
Figure 1B:
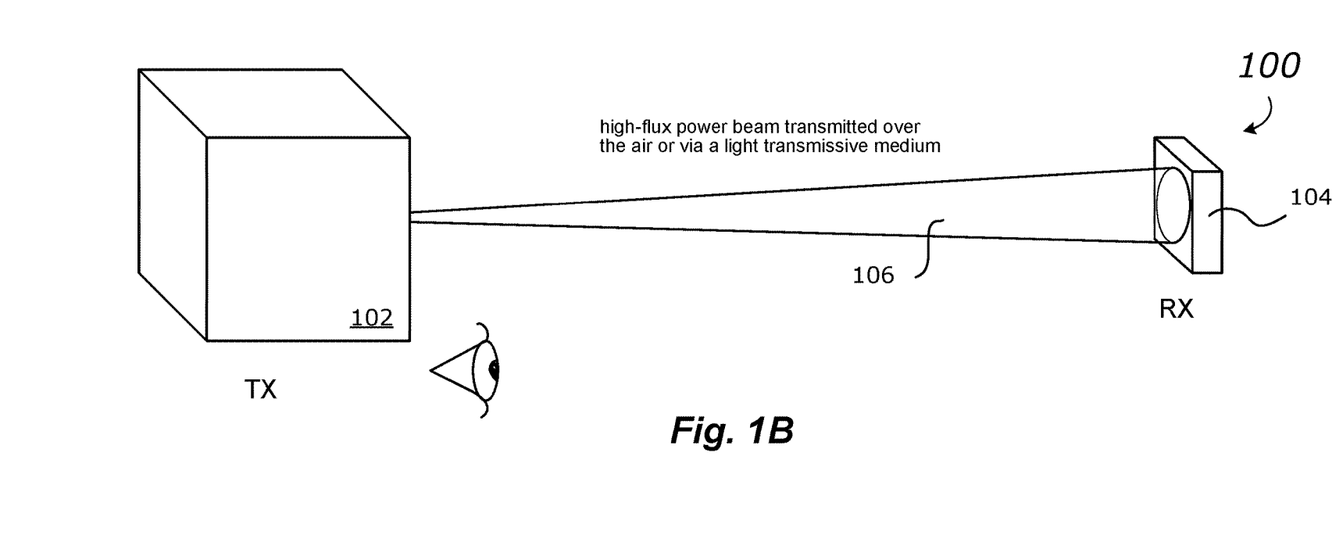

FIG. 1A and FIG. 1B depict one form of remote power delivery via a laser power beaming system 100. The laser power beaming system 100, which may also be called an optical remote power beaming system, includes at least one transmitter 102 and at least one receiver 104. In FIG. 1A, the laser power beaming system 100 is viewed from the perspective of the receiver 104 looking back at the transmitter 102. In FIG. 1B, the laser power beaming system 100 is viewed from the perspective of the transmitter 102 looking toward the receiver 104.

The transmitter 102 of FIG. 1 is a remote power transmitter arranged to output a high-flux power beam 106 (e.g., a high-energy beam of laser light), which is projected through the air or light or some light transmissive medium (e.g., fiber optic cable) over a distance toward the receiver 104. The receiver 104 of FIG. 1 is a remote power receiver arranged to receive the high-flux power beam. The receiver 104, which may be above ground level or in a remote area having an absence of easily available power (e.g., underwater, on a mountain, on top of a building or other elevated structure), includes any number of photo-voltaic (PV) cells mounted to capture flux from the high-flux power beam 106. At the receiver 104, the PV cells generate electrical power from energy in the high-flux power beam 106. The electrical power is then transported to one or more circuits (not shown) where the power is consumed.

In some cases, the transmitter 102 includes a laser assembly, which converts electric power into optical power (e.g., light), typically but not necessarily in the near-infrared (NIR) portion of the optical spectrum wavelength between 0.7 and 2.0 µm. The laser assembly may include a single laser or multiple lasers, which may be mutually coherent or incoherent. In some cases, the one or more lasers may be replaced by one or more light emitting diodes (LEDs), super-radiant diodes, fiber lasers, or some other high-intensity light source. The light energy output of the laser assembly may pass through any number of optical elements (e.g., optical fibers, lenses, mirrors, etc.) which convert the raw laser light to a beam of a desired size, shape (e.g., circular, rectangular, trapezoidal), power distribution, and divergence. Various elements of the laser assembly may also be arranged to aim the high-flux power beam 106 toward the receiver 104.

After leaving the transmitter 102, the high-flux power beam 106 travels through free space or a light transmissive medium (e.g., fiber-optic cable) toward the receiver 104. The term, "free space," as it is used in the present disclosure, means any reasonably transparent medium such as air or vacuum, water, gas, and the like. Free space is distinguished from a light transmissive mechanical medium such as an optical fiber or conduit that confines or encloses a high energy light beam or field, typically but not always by total internal reflection (TIR) (which, despite inclusion of the term "total," may include a certain amount of loss of light energy, particularly in implementations where the optical fiber or conduit is bent). Within the present disclosure, a free space or mechanical medium path may include one or more mirrors, lenses, prisms, or other discrete optical elements that redirect or alter particular characteristics of the high energy light.

At the receiver 104, the high-flux power beam 106 impinges a light reception module (not shown in FIG. 1). Energy from the high-flux power beam 106 is captured and converted, at least partly, back to another form of useful power. In some cases, the light reception module includes an array of photovoltaic (PV) cells which convert light to direct current (DC) electricity. In other cases, the light reception module converts light to electricity in other ways, for example by converting the optical power to heat, which drives a heat engine (e.g., Stirling engine, turbine), a thermoelectric device, or some other device.

Figure 2A:
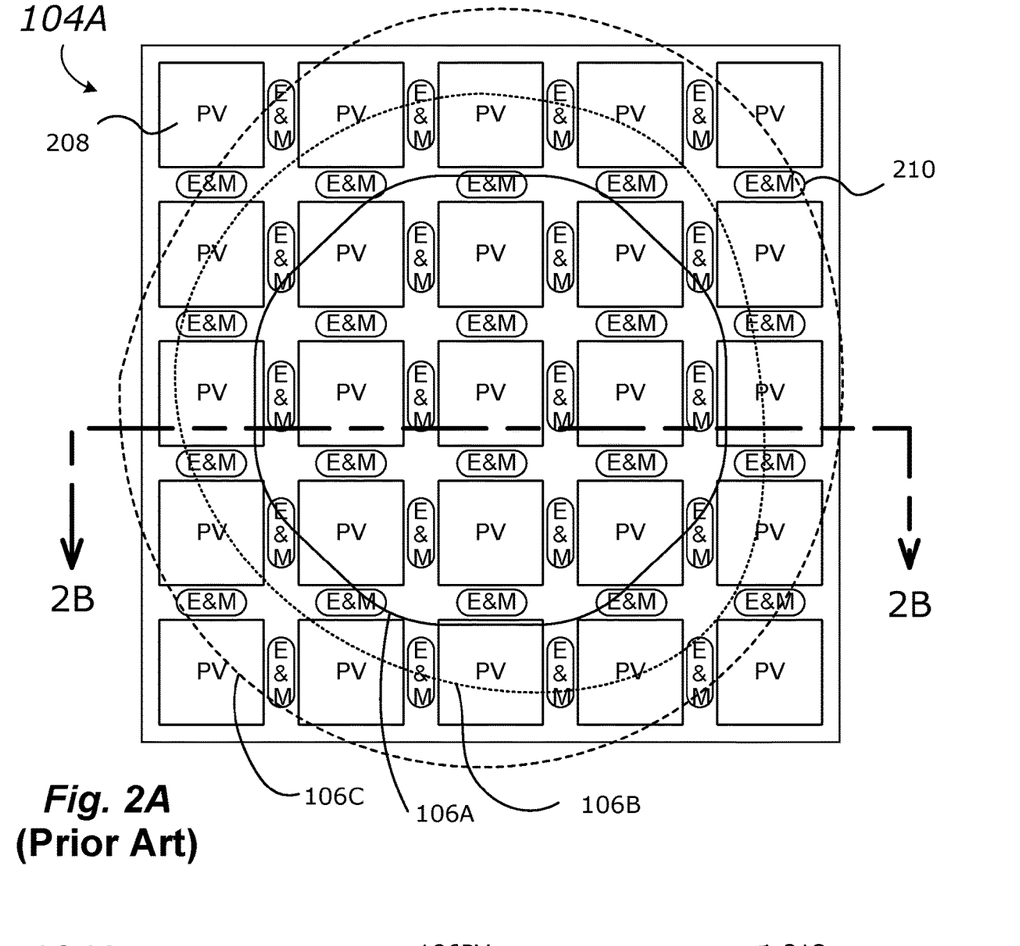
FIG. 2A is a front-side view of a conventional receiver.
Figure 2B:
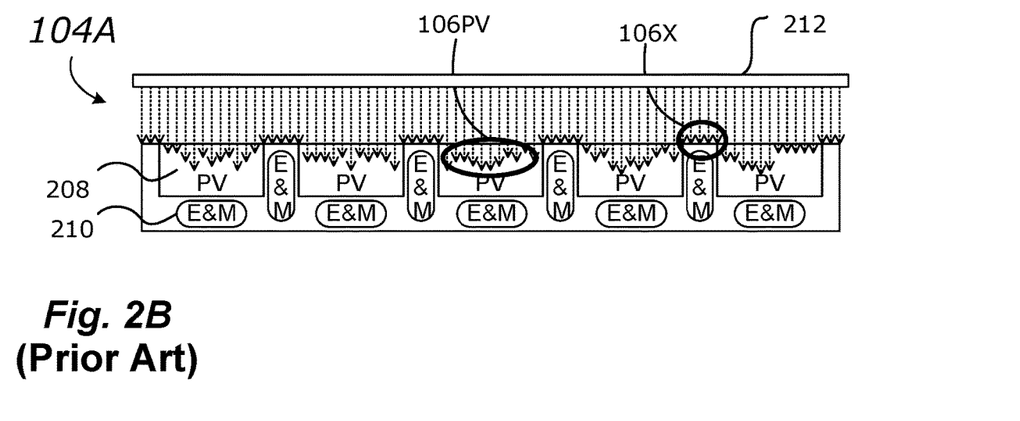
FIG. 2B is a cross-sectional view of the conventional receiver of FIG. 2A. Collectively, FIG. 2A and FIG. 2B may be referred to herein as FIG. 2.

FIG. 2A is a front-side view of a conventional receiver 104A. FIG. 2B is a cross-sectional view of the conventional receiver 104A taken at cross-sectional line 2B-2B.

The receiver 104A includes an array of photo-voltaic (PV) cells 208, and a collection of non-PV electrical circuits and mechanical structures 210. For simplicity in the figure, only one PV cell 208 is identified and only one collection of electrical circuits and mechanical structures 210 is identified. The non-PV electrical circuits and mechanical structures 210 are formed in one or more gaps between PV cells 208. For clarity in this and succeeding figures, PV cells 208 shown in cross-section have been drawn somewhat thicker than would be typical in an actual power receiver.

Ideally, there would be no gap between PV cells 208, but no such commercially available systems are known. Instead, the gaps between PV cells 208 are used for electronic circuits (e.g., power generation circuits, power conversion circuits, data storage, processors, transceivers, and the like), PV cell frames, heat dissipation structures, and the like. In some cases, some PV cells are formed directly adjacent to each other, but even in these cases, at least some gap (e.g., 0.25 millimeters, 0.5 millimeters, or some other gap) exists due to PV material frames, bonding material, the need to prevent electrical shorting between adjacent cells, and the like. In other cases, PV cells have been known to be "shingled" (i.e., the front of one edge of a PV cell overlaps and is behind the back of one edge of another PV cell), but even in these cases, there may remain gaps, which are not available to receive high-flux power and generate electricity therefrom.

Accordingly, in a high-flux power beam 106 delivered over time, there may be an absence of homogeneity from one edge to another edge while the central portion of the beam may in fact have a homogenous intensity. Hence, while the high-flux power beam 106 may be formed having a uniform circular cross-section, the high-flux power beam 106 that reaches the receiver may have some variation in intensity, particularly at its periphery. This is depicted in FIG. 2 by multiple circles 106A, 106B, 106C, which depict areas of higher to lower intensity.

In FIG. 2B, an optional cover 112 over the receiver passes light from the high-flux power beam 106 directly toward the PV cell 208 array. For simplicity in the figure, no reflection or refraction of the high-flux power beam 106 is shown. A first portion 106PV of the high-flux power beam 106 reaches the PV cell 208 material. A second portion 106X of the high-flux power beam 106 does not reach the PV cell 208 material.

Considering that the second portion 106X of the high-flux power beam 106 portion does not reach the PV cell 208 material, the present inventors have recognized that this loss makes the receiver 104A less efficient. Accordingly, the teaching of the present disclosure addresses this shortcoming and improves the operations of remote power receivers such as the receiver 104 of FIG. 1. As discussed herein, the teaching of the present disclosure describes various remote power beam-splitting embodiments.

Figure 3A:
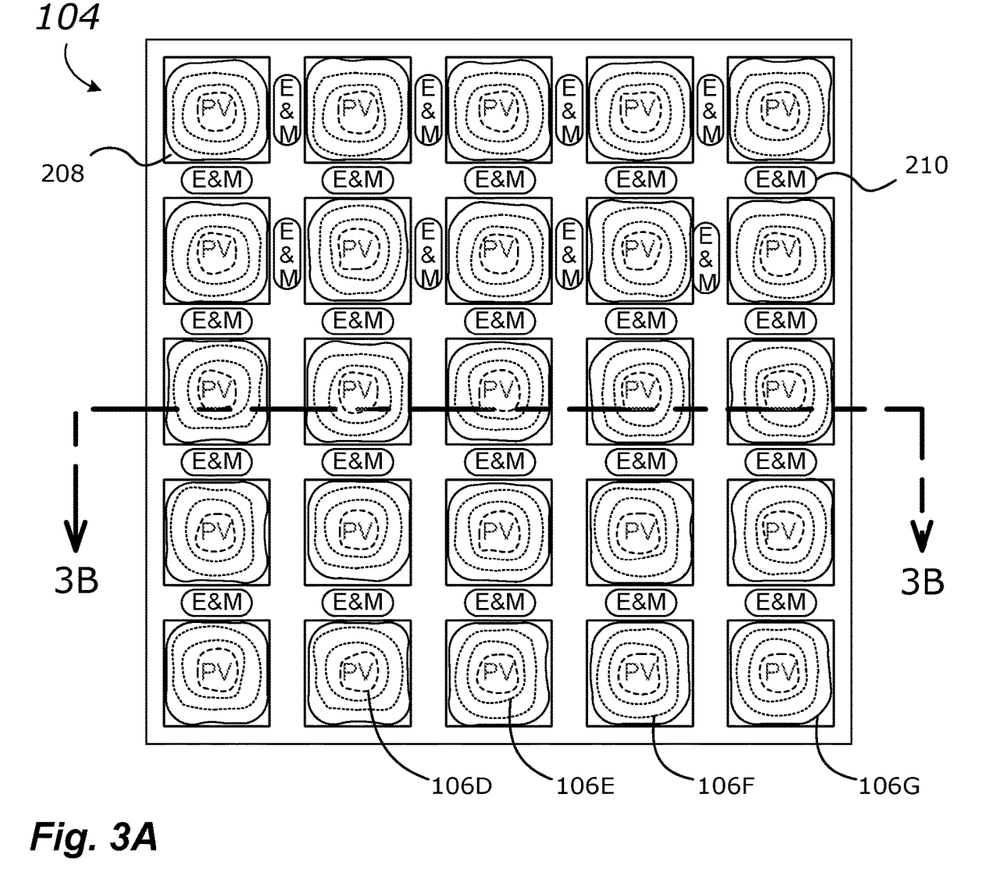
FIG. 3A is a front-side view of a remote power beam-splitting receiver embodiment including an array of converging lenslets.
Figure 3B:
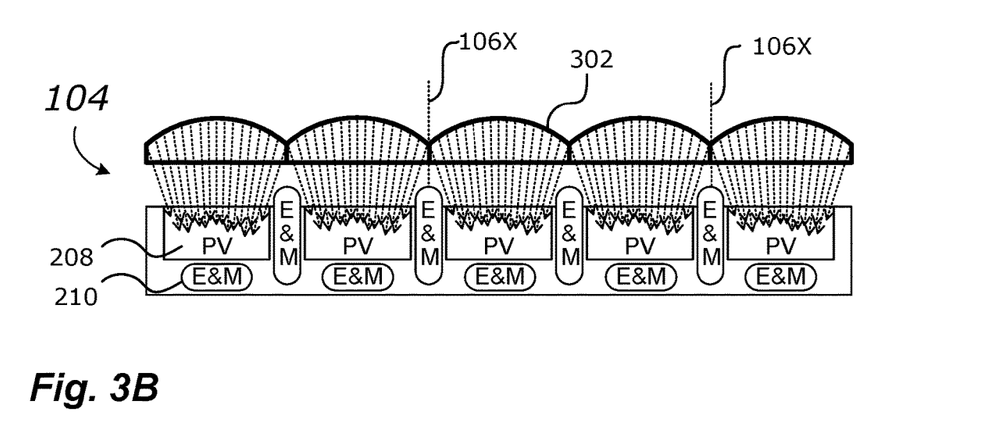
FIG. 3B is a cross-sectional view of the remote power beam-splitting receiver embodiment of FIG. 3A. Collectively, FIG. 3A and FIG. 3B may be referred to herein as FIG. 3.

FIG. 3A is a front-side view of an inventive remote power beam-splitting receiver 104. FIG. 3B is a cross-sectional view of the remote power beam-splitting receiver 104 of FIG. 3A taken at cross-sectional line 3B-3B. The receiver 104 of FIG. 3 includes a plurality of structures to steer flux toward some or all of the plurality of PV cells 208 and away from some or all of the non-PV structures (e.g., electrical circuits and mechanical structures 210).

The receiver 104 includes an array of photo-voltaic (PV) cells 208, and a collection of non-PV electrical circuits and mechanical structures 210. For simplicity, in FIG. 3A and FIG. 3B, only one PV cell 208 is identified and only one collection of non-PV electrical circuits and mechanical structures 210 is identified. The non-PV electrical circuits and mechanical structures 210 are formed in one or more gaps between PV cells 208. The gaps in the receiver 104 of FIG. 3B may be the same size, smaller, or larger than the gaps between PV cells 208 in the conventional receiver 104A of FIG. 2. As not shown in FIG. 3B, in some implementations, electrical circuits and mechanical structures 210 may extend above the surface of PV cells 208.

In FIG. 3B, a plurality of converging/concentrating lenslets 302 are arranged over individual ones of the PV cells 208. Each lenslet 302 of the plurality of lenslets is positioned between the incoming high-flux power beam 106 and a respective PV cell 208. The lenslets 302 converge or otherwise concentrate individual beamlets, rays, photons, or any other suitably named portion of the high-flux power beam 106 away from the non-PV portions of the receiver 104 and toward the PV material of PV cells 208.

In some cases, the individual lenslets 302 may be individually formed and arranged adjacent to each other (e.g., edge-to-edge, separated only by bonding material, separated only by bonding material and a frame, formed from a single piece of material, or the like). In some cases, the individual lenslets 302 may be formed as a single structure. The converging/concentrating lenslets 302 may be poured, molded, stamped, machined, or otherwise formed in ways that will be apparent to one of skill in the art.

In some embodiments, selected ones of the PV cells 208 are formed having a circular top-side shape. In other embodiments, selected ones of the PV cells 208 are formed having a square top-side shape, a rectangular top-side shape, a hexagonal top-side shape, or any other suitable top-side shape. Correspondingly, the lenslets may be formed in any suitable top-side shape (circular, square, rectangular, hexagonal, or the like), the lenslets may be formed to refract the light from the high-flux power beam 106 into any suitable shape such as a circle, square, rectangle, hexagon, or the like. In at least some cases, however, the lenslets 302 and the underlying PV cells 208 will have different top-side shapes.

In the embodiment of FIG. 3B, the lenslets 302 are arranged to converge beamlets of the high-flux power beam 106 toward the PV cells 208. A large volume of the high-flux energy of high-flux power beam 106 is shown as penetrating the PV material in FIG. 3. Various high-flux power beam portions 106D, 106E, 106F, 106G of varying intensity are shown in FIG. 3A. Notwithstanding the significant improvement in efficiency created by the lenslets 302, there may be some portion 106X of the high-flux power beam 106 that does not reach a PV cell 208. The portion 106X that does not reach a PV cell 208 may reflect from a seam between lenslets, pass through a seam between lenslets and reach a non-PV area of the receiver 104, or travel in some other direction away from PV material. Nevertheless, the embodiment of FIG. 3 is an improved receiver 104 that provides a greater quantity of energy from the high-flux power beam 106 at the PV cells 208 to be converted to electrical energy than was possible using previously-known receivers. Distinguishing the conventional receiver 104A of FIG. 2 from the improved receiver 104 of FIG. 3, particularly in the representations of FIG. 2A and FIG. 3A, significantly more energy from the high-flux power beam 106 reaches the PV cells 208 of FIG. 3 than reaches the PV cells 208 of FIG. 2, and significantly less energy from the high-flux power beam 106 reaches the electrical circuits and mechanical structures 210 of FIG. 3 than reaches in FIG. 2.

Figure 4A:
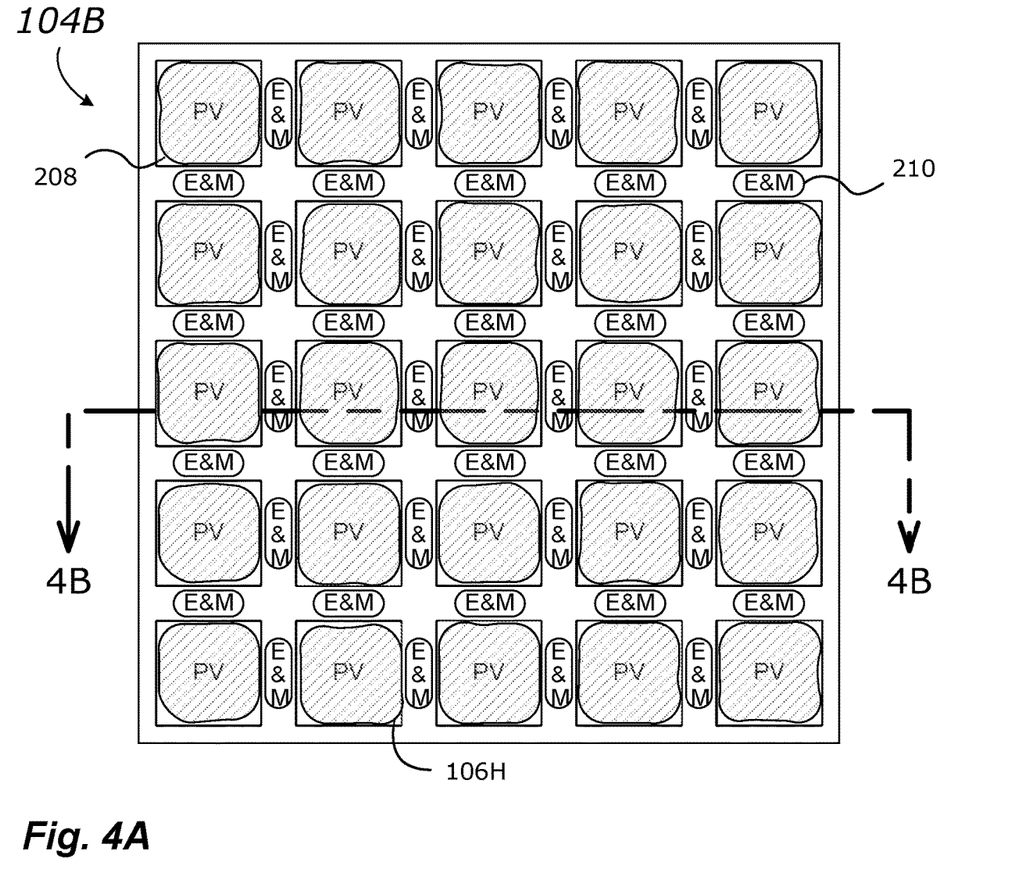
FIG. 4A is a front-side view of another remote power beam-splitting receiver embodiment including an array of converging lenslets and an array of diverging lenslets.
Figure 4B:
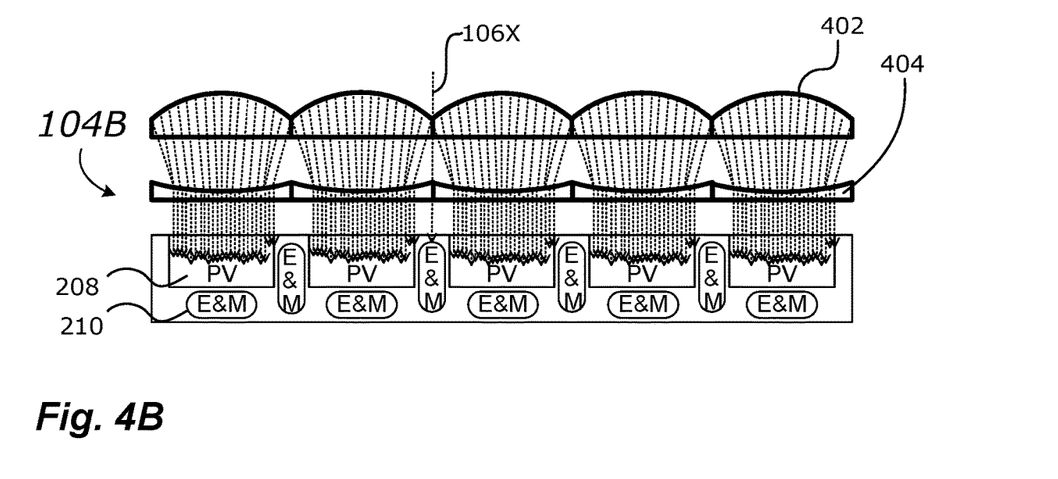
FIG. 4B is a cross-sectional view of the remote power beam-splitting receiver embodiment of FIG. 4A. Collectively, FIG. 4A and FIG. 4B may be referred to herein as FIG. 4.

FIG. 4A is a front-side view of another inventive remote power beam-splitting receiver 104B. FIG. 4B is a cross-sectional view of the remote power beam-splitting receiver 104B embodiment of FIG. 4A taken at cross-sectional line 4B-4B. The receiver 104B of FIG. 4 includes a first plurality of structures to steer flux toward some or all of the plurality of PV cells 208 and away from some or all of the non-PV structures (i.e., electrical circuits and mechanical structures 210) and a second plurality of structures to refract the high-flux power beamlets passing through the first plurality of structures directly toward respective surfaces of the PV cells 208.

Along the lines of FIG. 3, the receiver 104B includes an array of photo-voltaic (PV) cells 208, and a collection of non-PV electrical circuits and mechanical structures 210. For simplicity, certain features of the receiver 104B of FIG. 4A that are along the lines of such structures in FIG. 3A are not further discussed.

In FIG. 4B, along the lines of FIG. 3B, a plurality of converging/concentrating lenslets 402 are arranged over individual ones of the PV cells 208. Each lenslet 402 of the plurality of lenslets is positioned between the incoming high-flux power beam 106 and a respective PV cell 208. The lenslets 402 converge or otherwise concentrate, and in some cases steer, individual beamlets, rays, photons, or any other suitably named portion of the high-flux power beam 106 away from the non-PV portions of the receiver 104B and toward the PV material of PV cells 208.

In the embodiment of the receiver 104B of FIG. 4B, a second plurality of lenslets 404 is positioned between respective lenslets 402 and particular PV cells 208. The second plurality of lenslets 404 may be diverging lenses arranged to change the angular spread of incoming flux so that a range of incident angles is narrower. The second plurality of diverging lenslets 404 cause beamlets to become more collimated and closer to normal angle incidence on the PV cells 208. In at least some cases, the diverging lenslets 404 may also steer or otherwise direct the beamlets to a desirable portion of a respective PV cell 208.

In some cases, the individual lenslets 404 may be individually formed and arranged edge-to-edge, and in other cases, individual diverging lenslets 404 may be separated from each other due to frames, bonding material, a design that reduces material costs, or for some other reason. In some cases, the individual lenslets 404 may be formed as a single structure. The diverging lenslets 404 may be poured, molded, stamped, machined, or formed in some other way.

In the embodiment of FIG. 4B, the first lenslets 402 and the second lenslets 404 cooperate to converge and collimate beamlets of the high-flux power beam 106 toward the PV cells 208. In this arrangement, the collimated beamlets may reach the PV cells 208 in a substantially orthogonal orientation, which in some cases, and for some PV cell designs, will permit a larger amount of the high-flux energy of high-flux power beam 106 to penetrate the PV material in FIG. 4B with substantial uniformity. For example, multi junction PV cells are typically designed with thicknesses between each junction layer selected to equalize the amount of light absorbed at each layer for light reaching the PV cell in a particular orientation (often, but not always, orthogonal). When light arrives at a different angle than the PV cell is designed for, this equalization may be disturbed. PV cells also contain internal gridlines which are used to transfer electrical energy out of the cell; light arriving at the cell surface at a non-normal angle may increase the shading effect of these gridlines. Finally, some PV cells are designed with anti-reflective coatings, whose anti-reflective effects may be sensitive to the angle of light reaching the cell. Similar to seams of the lenslets 402 in FIG. 3, the seams of first and second lenslets 402, 404 in FIG. 4 may also prevent some portion 106X of flux from reaching the PV cells 208.

In some cases, PV cells 208 of the present disclosure may range from about two millimeters (2 mm) on a side to as large as 100 mm on a side. Other sizes and shapes are of course contemplated. In some cases, the PV cells 208 of the present disclosure are generally square or rectangular in shape and are arranged in square or rectangular arrays, optionally with truncated corners. In at least one case, PV cells 208 are about 10 mm on a side; and in some cases, PV cells 208 may range from about 5 mm to about 15 mm on a side. An array of cells at receiver 104 may be, for example, 10 cm to 100 cm across, 20 cm to 60 cm across, or about 45 cm across. In some cases, a receiver 104 may have one PV cell 208, four PV cells 208, 100 PV cells 208, or some other number of PV cells 208. In at least some cases, receivers 104 are contemplated with an even larger numbers of PV cells 208.

In at least some embodiments, the converging/concentrating lenslets 302, 402 of the present disclosure will be larger than the PV cells 208, and the concentration ratios might be between about one and one-half times (1.5×) and about fifty times (50×). In such cases, for a square layout, this implies that each converging/concentrating lenslet 302, 402 dimension is the desired spot size times the square root of the concentration ratio. For example, about (1.2*spot size) up to about (7.1*spot size). In at least some cases, receivers 104 are formed having a converging/concentrating lenslet 302, 402 concentration ratio in the range of about 2 to about 50, about 3.5 to about 25, or about 4 to about 15. In one known case, converging/concentrating lenslets 302, 402 are about 3.4 cm across, while the active area of each PV cell 208 is about one centimeter (1 cm), and in this case, the target spot size was about 0.8 cm. These dimensions correspond to a concentration ratio of (3.4 cm/0.8 cm)² or about 18. These concentration ratios may be contrasted with typical concentration ratios for solar concentrators, which may use superficially similar structures for other purposes under other conditions. In particular, solar concentrators typically have concentration ratios on the order of 50×-500×. These higher concentration ratios allow solar concentrators to concentrate relatively weak sunlight onto solar PV cells in order to conserve PV cell material and operate in more favorable energy regimes. In contrast, the power beaming systems described herein use laser light to illuminate PV cells (which may in some cases be tuned for efficiency at one or more specific laser frequencies). This laser light may typically be substantially more intense than sunlight, at least at the specific frequencies of interest, and lower concentration ratios have been found to be sufficient to direct a substantial fraction of the laser light onto the PV cells without creating energy intensities that may cause melting or other damage to the receiver system. The receivers described herein may attempt to collect as much of the incident laser light as possible (e.g., more than 80%, more than 90%, more than 95%, more than 98%, or substantially all of the incident laser light), in contrast to solar collectors, which typically are designed without much concern for "missed" light, since sunlight is abundantly available across a large receiver area instead of being limited to an area of a power beam.

In some embodiments taught herein, PV cell 208 materials for laser power are one of GaAs, InGaAs, Si, or GaSb. Converging/concentrating lenslets 302, 402 may be formed of materials such as optical glass (e.g., BK7) or known optical plastic (e.g., polycarbonate or acrylic). In some embodiments taught herein, reflective structure may be formed of materials such as aluminized Mylar with a support structure, or some other reflective or reflectively coated materials such as aluminum, carbon fiber composite, or plastic.

FIG. 5-FIG. 9 depict additional receiver embodiments. The additional embodiments of receivers 104C, 104D, 104E, 104F respectively, are arranged to split or otherwise redirect portions of a high-flux power beam 106 toward the PV material of a PV cell 208. It is noted that since only a few arrows depicting light direction are shown in FIG. 5-FIG. 9, they are also shown terminating at the surface of PV cell 208. It will of course be understood that light may penetrate a certain distance into photovoltaic cells in use and that this surface termination is for clarity in the drawing.

Figure 5:
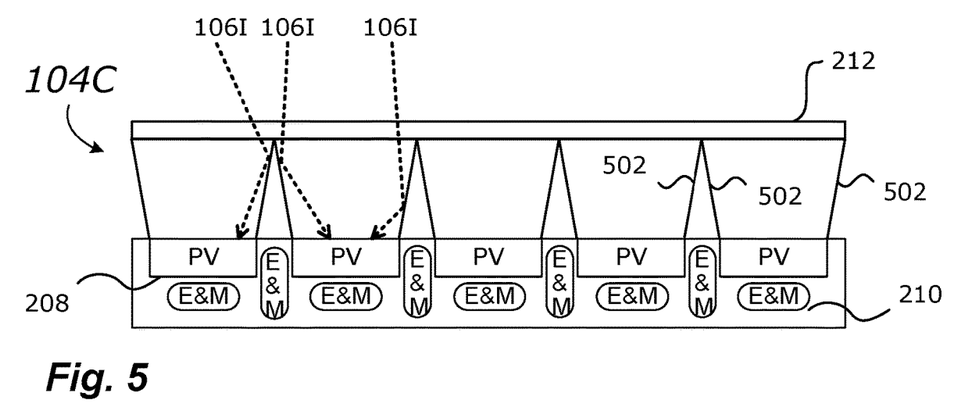
FIG. 5 is a cross-sectional view of another remote power beam-splitting receiver embodiment including substantially flat reflectors.

In FIG. 5, reflective structures 502 are planar structures that surround the PV cell 208 (e.g., a rectangular PV cell 208 will have four surrounding planar reflective structures 502, a hexagonal PV cell 208 will have six surrounding planar reflective structures 502, and so on) on power receiver 104C. Reflective structures 502 are topped with an optional cover sheet 212 as described above in connection with FIG. 2. In at least some of these cases, each reflective structure 502 of a plurality of reflective structures 502 that is adjacent to one of four edges of a respective rectangular (e.g., square) PV cell 208 is further adjacent to two other reflective structures 502 that also meet the same PV cell 208. In such an arrangement, a substantial fraction or even nearly all of the light of a high-flux power beam 106 will be directly or indirectly passed to a PV cell 208. Also in such cases, various other embodiments may be formed to also direct light that is otherwise directed toward top-side seams (e.g., bond lines) of adjoining reflective structures 502 may be diverged away from such seams (further discussed below in connection with FIG. 9).

While each reflective structure 502 may be arranged at an angle that is substantially orthogonal to a respective PV cell 208, the reflective structures 502 shown in FIG. 5 are not exactly normal to the PV cell 208. That is, the reflective structures 502 in FIG. 5 have an incident angle that permits the structures to re-direct and capture flux that would otherwise strike the non-PV electrical circuits and mechanical structures 210. In some cases, the reflective structures 502 are within 10 degrees of normal, within 20 degrees of normal, within 30 degrees of normal, or at some other position. In some cases, the angle offset from normal of each reflective structure 502 is based on the size of the reflective structures and the amount of space between adjacent PV cells 208. For example, if the reflective structures 502 are 20 degrees from normal [orthogonal], then in the case of incident light entering "vertically" (normal to the surface defined by the PV cells), light reflecting off one surface 502 would make an angle of 40 degrees from normal relative to the PV 208. For example, if the cells are 1 cm wide, the space between cells is 1 cm, and the reflective structures are centered on the PV cells, then each reflective structure module would be 2 cm wide, creating a concentration ratio of 4×. A planar surface angled 20 degrees from normal would then have a height of 1.37 cm (calculated as 0.5 cm width/tan(20°)).

Figure 6:
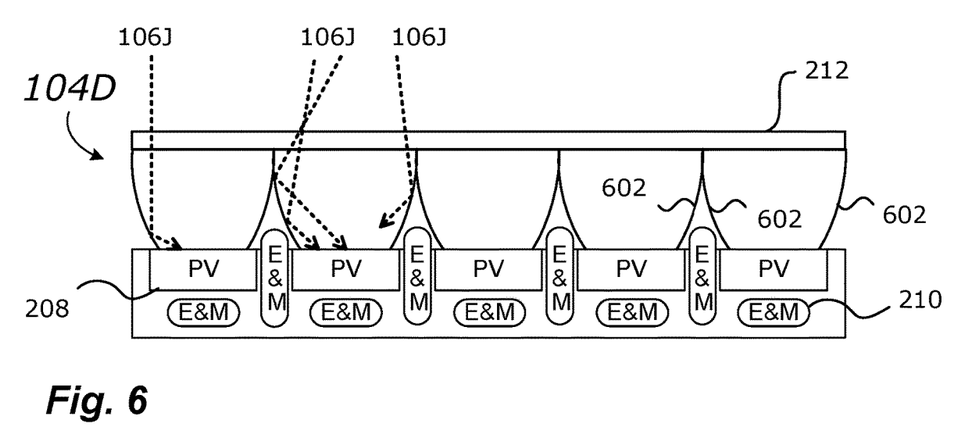
FIG. 6 is a cross-sectional view of another remote power beam-splitting receiver embodiment including curved reflectors.

In FIG. 6, power receiver 104D includes reflective structures 602 that are curved (e.g., parabolic, conic, circular, hyperbolic, or with some other selected curvature) surrounding the PV cell 208. These curves could be concave or convex; as illustrated in FIG. 6, reflective structures 602 are concave. Along the lines of FIG. 5, reflective structures 602 are topped with optional cover sheet 212. In some cases, the parabolic reflective structures 602 may be arranged around rectangular PV cells, hexagonal PV cells, or PV cells of some other arrangement along the lines of the reflective structures 502 of FIG. 5. It will be understood that some embodiments may include a mixture of flat reflectors 502 as shown in FIG. 5 and curved reflectors 602 as shown in FIG. 6.

Figure 7:
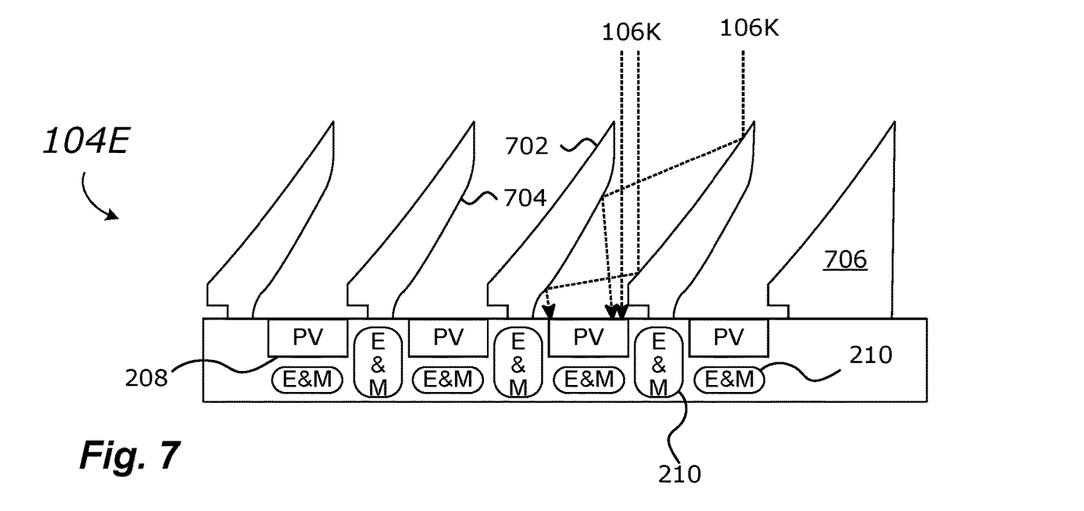
FIG. 7 is a cross-sectional view of another remote power beam-splitting receiver embodiment including primary and secondary reflectors.

FIG. 7 depicts another embodiment of a receiver 104E in cross-sectional view. In this embodiment, reflective structures 702 are primary reflective structures that partially surround the PV cell 208, working in cooperation secondary reflective structures 704. The primary reflective structures 702, which may be curved or flat, may further be arranged around rectangular PV cells, hexagonal PV cells, ovular PV cells, circular PV cells, or PV cells of some other arrangement. Still other embodiments are contemplated. Secondary structures 704 are formed to re-direct primary reflections from primary reflectors 702 toward the PV material of an underlying PV cell 208 and have whatever shape is appropriate to cooperate with primary reflectors 702 to reflect light onto PV cells 208. This design is related to certain optical reflective telescopes that will be familiar to those of ordinary skill in the art. In some embodiments, as shown in FIG. 7, these shapes 702, 704 may represent left sides and right sides of the same three-dimensional structure. In some cases, PV cells 208 may be conveniently arranged in rows with only small gaps in the direction perpendicular to the paper, or even shingled atop one another in this direction (as outlined in copending and commonly owned published U.S. Patent application 2019/0020304), and electrical circuits and mechanical structures 210 may be placed on the left and right sides of PV cells 208 as shown. Alternatively, this type of two-dimensional embodiment may be combined with a similar two-dimensional lens embodiment such as that shown in FIG. 3B or FIG. 4B, with the lens axis being perpendicular to the reflector axis so that the incident light is divided onto PV cells 118.

Further still, an edge reflective structure 706 may be formed at an edge of the receiver 104E. The edge reflective structure 706 may have an inverse curvature relative to the reflective structures 702, a different curvature, or the edge reflective structure may take any other suitable shape and orientation (e.g., planar and exactly or substantially orthogonal, planar and having a different angle relative to the surface of the PV cell 208, having a complex shape). The curvature of structures 702 (and of 706, if present), permit electrical circuits and mechanical structures 210 to be placed between the PV cells 208 while directing light that would otherwise reach the electrical circuits and mechanical structures 210 onto PV cells 208. Each PV cell 208 may be surrounded by a mixture of primary reflective structures 702, secondary reflective structures 704, and/or edge reflective structures 706.

Figure 8:
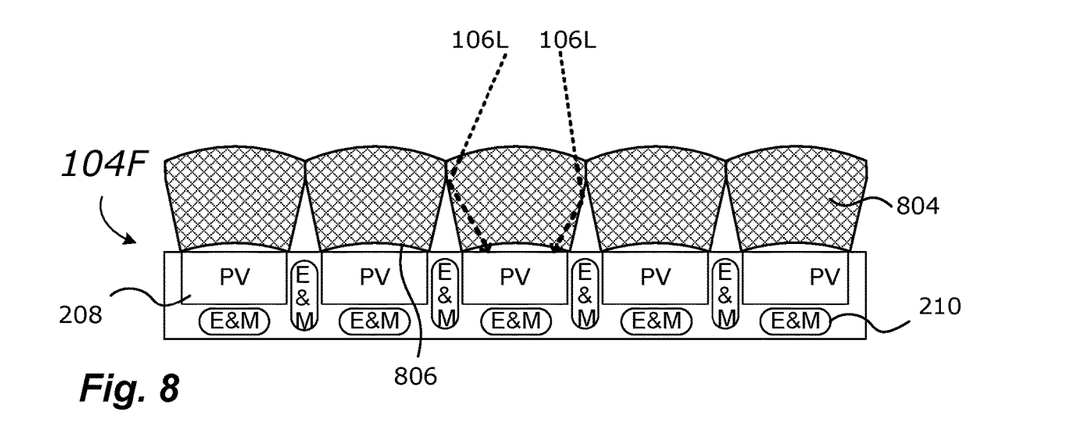
FIG. 8 is a cross-sectional view of another remote power beam-splitting receiver embodiment including a total internal reflection (TIR) material.

In FIG. 8, a total-internal-reflection (TIR) material 804 is formed in a receiver 104F having a desirable shape, size, density, and other such characteristics over each PV cell 208. Those portions of the high-flux power beam 106 that are less than the TIR angle for that material and the material bordering it (normally air or possibly glue attaching it to an adjacent structure 804 or a sidewall) will be constrained to propagate within the TIR material 804 until they exit at the bottom. As illustrated, the top and bottom surfaces of the TIR material 804 are curved, but they may also be flat, angled, or of any other optically and mechanically suitable shape. In an arrangement such as that illustrated in FIG. 8, nearly all of the light of a high-flux power beam 106L will be passed to a PV cell 208, avoiding electrical circuits and mechanical structures 210. In some embodiments, exit surface of the TIR material 804 may be dimpled or textured to blur exiting light somewhat before it reaches PV cell 208.

Figure 9:
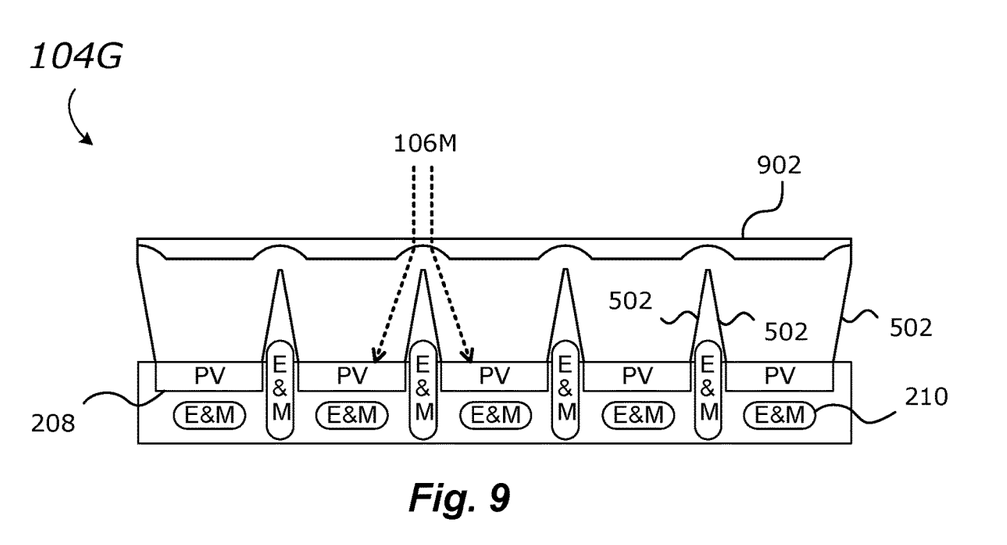
FIG. 9 is a cross-sectional view of another remote power beam-splitting receiver embodiment including an array of diverging lenslets.

FIG. 9 is yet one more receiver embodiment 104G shown in cross-section. In the embodiment, a window having a plurality of diverging lenslet elements 902 is positioned between the high-flux power beam 106 and a seam where each reflective structure 502 of a plurality of reflective structures 502 that are adjacent to certain edges (e.g., one of the four edges) of a respective PV cell 208 adjoins another reflective structure 502 that is coupled to a second nearby PV cell 208. In some cases, the bond lines between adjacent reflective structures 502 is very narrow, but these bond lines can reflect or otherwise prevent some portion of the high-flux power beam 106 from reaching PV material of a PV cell 208. To remediate this shortcoming, diverging lenslets 902 may be positioned above the seams to divert that particular portion 106M that would otherwise be lost toward a PV cell 208. In some cases (as illustrated), the diverging lenslets 902 are grooves or otherwise concave lenslets formed on the back side of a cover window (e.g., receiver cover 112).

Certain high-flux power beam portions 106I are shown in FIG. 5, and other various high-flux power beam portions 106J, 106K, 106L are shown in FIG. 6 to FIG. 9. The number of portions, intensity of portions, angles of incidence, angles of reflection, and other such properties and characteristics of the high-flux power beam portions 106I, 106J, 106K, 106L of FIG. 5 to FIG. 9 are exemplary and not limiting. Many other shapes, orientations, angles, and other such characteristics are contemplated. In addition, with respect to the embodiments of FIG. 3 to FIG. 9, it is recognized that still other embodiments may be formed with teachings of one embodiment combined with teachings of another. For example, in some cases, embodiments may be formed having reflectors and reflective material of any suitable materials and any simple shapes, complex shapes, different shapes, and the like.

In certain embodiments, the present disclosure teaches lenslets to concentrate light from a high-flux power beam 106. In other embodiments, the present disclosure teaches lenslets to diverge light from a high-flux power beam 106. And in still other embodiments, the present disclosure teaches reflectors (including flat reflectors, curved reflectors, and TIR reflectors) to change the direction of light from a high-flux power beam 106. The various embodiments disclosed herein may be suitably combined to increase the amount of light from a high-flux power beam 106 that reaches one or more PV cells.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

In the present disclosure, when an element (e.g., component, circuit, device, apparatus, structure, layer, material, or the like) is referred to as being "on," "coupled to," or "connected to" another element, the elements can be directly on, directly coupled to, or directly connected to each other, or intervening elements may be present. In contrast, when an element is referred to as being "directly on," "directly coupled to," or "directly connected to" another element, there are no intervening elements present.

The terms "include" and "comprise" as well as derivatives and variations thereof, in all of their syntactic contexts, are to be construed without limitation in an open, inclusive sense, (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the present disclosure, the terms first, second, etc., may be used to describe various elements, however, these elements are not be limited by these terms unless the context clearly requires such limitation. These terms are only used to distinguish one element from another. For example, a first machine could be termed a second machine, and, similarly, a second machine could be termed a first machine, without departing from the scope of the inventive concept.

The singular forms "a," "an," and "the" in the present disclosure include plural referents unless the content and context clearly dictates otherwise. The conjunctive terms, "and" and "or" are generally employed in the broadest sense to include "and/or" unless the content and context clearly dictates inclusivity or exclusivity as the case may be. The composition of "and" and "or" when recited herein as "and/or" encompasses an embodiment that includes all of the elements associated thereto and at least one more alternative embodiment that includes fewer than all of the elements associated thereto.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

The headings and Abstract of the Disclosure provided herein are for convenience only and do not interpret the scope or meaning of the embodiments.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Generally, unless otherwise indicated, the materials for making the invention and/or its components may be selected from appropriate materials such as metal, metallic alloys, semiconductors, ceramics, plastics, etc.

Beamed-power transmission system 100 may further include operative software found in a conventional embedded device such as an operating system, software drivers to direct operations through the I/O circuitry, networking circuitry, and other peripheral component circuitry. In addition, beamed-power transmission system 100 may include operative application software such as network software for communicating with other computing devices, database software for building and maintaining databases, and task management software for distributing the communication and/or operational workload amongst various CPU's. In some cases, beamed-power transmission system 100 is a single hardware device having the hardware and software listed herein, and in other cases, beamed-power transmission system 100 is a networked collection of discrete hardware and software devices working together to execute the functions of the beamed-power transmission system. The conventional hardware and software of the transmitter 102 and receiver 104 are not shown in the figures for simplicity.

The various embodiments described above can be combined to provide further embodiments. Aspects of the embodiments can be modified, if necessary, to employ concepts of the various patents, applications, and publications referenced herein to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A remote power system, comprising:
a remote power transmitter configured to output a high-flux power beam from a laser; and
a remote power receiver configured to receive the high-flux power beam, the receiver including:
at least two photo-voltaic (PV) cells configured to convert at least a portion of light energy of the high-flux power beam to electrical energy;
a non-PV structure adjacent to the at least two PV cells; and
a light-steering structure configured to steer flux away from the non-PV structure and toward the at least two PV cells, wherein the light-steering structure has a concentration ratio in the range of about 1.5 to about 50.

2. The remote power system of claim 1, wherein the light-steering structure is configured to steer a contiguous power beam into at least two noncontiguous regions corresponding to locations of the at least two PV cells.

3. The remote power system of claim 1, wherein the non-PV structure is between the at least two PV cells.

4. The remote power system of claim 1, wherein the at least one non-PV structure includes one or more of wiring, a power conversion circuit, and a frame structure to support a PV cell.

5. The remote power system of claim 1, wherein the light-steering structure includes a first plurality of lenslets, each lenslet positioned at least partially between the high-flux power beam and a PV cell of the at least two PV cells.

6. The remote power system of claim 5, wherein at least two lenslets of the first plurality of lenslets are arranged edge-to-edge.

7. The remote power system of claim 5, wherein each lenslet of the first plurality of lenslets is a converging lens.

8. The remote power system of claim 5, wherein the light-steering structure further comprises: a second plurality of lenslets, each lenslet of the second plurality of lenslets positioned between a respective lenslet of the first plurality of lenslets and a PV cell.

9. The remote power system of claim 8, wherein at least two lenslets of the second plurality of lenslets are arranged adjacent to each other.

10. The remote power system of claim 8, wherein each lenslet of the second plurality of lenslets is a diverging lens.

11. The remote power system of claim 1, wherein the light-steering structure further comprises: a plurality of reflective structures, each reflective structure of the plurality of reflective structures positioned to reflect light onto a PV cell.

12. The remote power system of claim 11, wherein a reflective structure of the plurality of reflective structures is a planar reflective structure.

13. The remote power system of claim 11, wherein a reflective structure of the plurality of reflective structures is a curved reflective structure.

14. The remote power system of claim 11, wherein each PV cell is a rectangular PV cell, and wherein each PV cell has one reflective structure of the plurality of reflective structures adjacent to each of its four edges.

15. The remote power system of claim 1, wherein the plurality of structures further comprises: a plurality of total-internal-reflection (TIR) structures, each TIR structure of the plurality of reflective structures substantially overlying a respective PV cell.

16. The remote power system of claim 1, wherein the plurality of structures comprises: a plurality of individually formed lenslets.

17. The remote power system of claim 1, wherein the plurality of structures comprises: a plurality of lenslets formed as a single structure.

18. The remote power system of claim 1, wherein the light steering structure has a concentration ratio in the range of about 3.5 to about 25.

19. The remote power system of claim 1, wherein the light steering structure has a concentration ratio in the range of about 4 to about 15.

20. A remote power system, comprising:
    a remote power transmitter configured to output a high-flux power beam from a laser; and
    a remote power receiver configured to receive the high-flux power beam, the receiver including:
        at least two energy converters configured to convert at least a portion of flux of the high-flux power beam to electrical energy;
        a non-energy-converter structure adjacent to the at least two energy converters; and
        a light-steering structure configured to steer flux away from the non-energy-converter structure and toward the at least two energy converters, wherein the light-steering structure has a concentration ratio in the range of about 1.5 to about 50.

21. The remote power system of claim 20, wherein the light-steering structure is configured to steer a contiguous power beam into at least two noncontiguous regions corresponding to locations of the at least two energy converters.

22. The remote power system of claim 20, wherein the non-energy-converter structure is between the at least two energy converters.

23. A method of operating a power beaming system, comprising:
    transmitting a high-flux power beam from a laser transmitter;
    receiving the high-flux power beam at a receiver including at least two energy converters and a non-energy-converter structure; and
    steering the received high-flux power beam away from the non-energy-converter structure and toward the at least two energy converters with a the light-steering structure having a concentration ratio in the range of about 1.5 to about 50.

24. The method of claim 23, wherein steering the received high-flux power beam includes steering the received beam into at least two noncontiguous regions corresponding to locations of the at least two energy converters.

25. The method of claim 23, wherein the non-energy-converter structure is positioned between the at least two energy converters.

26. The method of claim 23, wherein the at least two energy converters are photovoltaic (PV) cells.

* * * * *